United States Patent
Carletti et al.

(10) Patent No.: US 10,411,689 B2
(45) Date of Patent: Sep. 10, 2019

(54) INCREASE ROBUSTNESS OF DEVICES TO OVERVOLTAGE TRANSIENTS

(71) Applicant: Infineon Technologies AG, Neubiberg (DE)

(72) Inventors: Andrea Carletti, Munich (DE); Gerold Schrittesser, Keostenberg (AT); Albino Pidutti, Villach (AT)

(73) Assignee: Infineon Technologies AG, Neubiberg (DE)

( * ) Notice: Subject to any disclaimer, the term of this patent is extended or adjusted under 35 U.S.C. 154(b) by 416 days.

(21) Appl. No.: 15/222,418

(22) Filed: Jul. 28, 2016

(65) Prior Publication Data

US 2018/0034457 A1     Feb. 1, 2018

(51) Int. Cl.
| | | |
|---|---|---|
| H02H 3/22 | (2006.01) | |
| H03K 17/081 | (2006.01) | |
| H03K 17/082 | (2006.01) | |
| H03K 17/08 | (2006.01) | |

(52) U.S. Cl.
CPC ... H03K 17/08104 (2013.01); H03K 17/0822 (2013.01); *H03K 2017/0806* (2013.01)

(58) Field of Classification Search
USPC .................................................. 361/56, 111
See application file for complete search history.

(56) References Cited

U.S. PATENT DOCUMENTS

| 4,896,245 A | * | 1/1990 | Qualich | ................. H02H 5/044 |
| | | | | 361/103 |
| 5,119,265 A | * | 6/1992 | Qualich | ................. H03K 17/08 |
| | | | | 323/907 |
| 5,731,729 A | * | 3/1998 | Ochi | ................... H01L 27/0251 |
| | | | | 327/312 |
| 5,789,951 A | * | 8/1998 | Shen | ................. H03K 17/0828 |
| | | | | 327/110 |
| 2009/0045788 A1 | * | 2/2009 | Williams | ............... H02M 1/32 |
| | | | | 323/273 |
| 2009/0296291 A1 | * | 12/2009 | Volke | ................ H03K 17/0822 |
| | | | | 361/56 |
| 2016/0049786 A1 | * | 2/2016 | Kinzer | ................... H02H 9/045 |
| | | | | 361/91.2 |
| 2017/0155244 A1 | * | 6/2017 | Dickey | .................. H02H 3/044 |
| 2018/0034457 A1 | * | 2/2018 | Carletti | ........... H03K 17/08104 |

OTHER PUBLICATIONS

"Safe Operating Area", Wikipedia, retrieved from https://en.wikipedia.org/wiki/Safe_operating_area, retrieved on Jun. 21, 2016, 3 pp.

(Continued)

*Primary Examiner* — Ronald W Leja
(74) *Attorney, Agent, or Firm* — Shumaker & Sieffert, P.A.

(57) ABSTRACT

In one example, a method includes selectively activating, by control logic and based on a control signal, a switch; in response to determining that an electrical characteristic of a signal provided to the switch satisfies a threshold while the switch is deactivated, activating, by the control logic and regardless of the control signal, the switch until determining that a potential of the signal provided to the switch satisfies a threshold potential; and in response to determining that the potential of the signal provided to the switch satisfies the threshold potential, deactivating the switch.

20 Claims, 10 Drawing Sheets

(56) References Cited

OTHER PUBLICATIONS

"Avalanche Breakdown", Wikipedia, retrieved from https://en.wikipedia.org/wiki/Avalanche_breakdown, retrieved on Jun. 21, 2016, 2 pp.
Schindler, et al., "Project Review EMC Optimized Gate Driver Design", Dec. 17, 2014, 27 pp.
International Standard, "Road vehicles—Electrical Disturbances from conduction and coupling—Part 2: Electrical transient conduction along supply lines only", Sep. 15, 2004, 42 pp.

* cited by examiner

INCREASE ROBUSTNESS OF DEVICES TO OVERVOLTAGE TRANSIENTS

TECHNICAL FIELD

The following disclosure relates to semiconductor device overstress detection.

BACKGROUND

Semiconductor devices, such as power metal-oxide-semiconductor field-effect transistors (MOSFETs), insulated-gate bipolar transistors (IGBTs), and other such devices including diodes, are sometimes subject to stressful operating environments. A stressful operating environment may damage or degrade the component and may eventually cause the component to permanently fail. When a component fails, the failed component may undergo failure analysis.

In order to adequately perform analysis of a failed or damaged component, it may be desirable to understand the operating conditions of the component from the time leading up to, and during a failure. For example, one of the most common stress conditions that may lead to a failed semiconductor device are electrical transients (i.e., voltage spikes) along supply lines. These transients, sometimes referred to as ISO pulses, may cause unprotected devices to exceed their maximum ratings and become stressed.

While some components can often withstand the high power dissipation that may occur as a result of such transients for a short amount of time, eventually prolonged or repeated exposure to transients may cause permanent damage (e.g., according to the Wunsch-Bell breakdown characteristic of the device). When a device is undergoing failure analysis, it may not always be clear from visual inspection and/or other evidence about its failure, whether such a transient occurred, which may result in an improper or misdiagnosed failure.

SUMMARY

In one example, a method includes selectively activating, by control logic and based on a control signal, a switch; in response to determining that an electrical characteristic of a signal provided to the switch satisfies a threshold while the switch is deactivated, activating, by the control logic and regardless of the control signal, the switch until determining that a potential of the signal provided to the switch satisfies a threshold potential; and in response to determining that the potential of the signal provided to the switch satisfies the threshold potential, deactivating the switch.

In another example, a system includes a switch configured to receive a signal; and control logic configured to: selectively activate, based on a control signal, the switch; responsive to determining that an electrical characteristic of a signal provided to the switch satisfies a threshold while the switch is deactivated, activate, regardless of the control signal, the switch until determining that a potential of the signal provided to the switch satisfies a threshold potential; and responsive to determining that the potential of the signal provided to the switch satisfies the threshold potential, deactivate the switch.

In another example, a device includes means for selectively activating, based on a control signal, a switch; means for, responsive to determining that an electrical characteristic of a signal provided to the switch satisfies a threshold while the switch is deactivated, activating, regardless of the control signal, the switch until determining that a potential of the signal provided to the switch satisfies a threshold potential; and means for, responsive to determining that the potential of the signal provided to the switch satisfies the threshold potential, deactivating the switch.

DETAILED DESCRIPTION

Figure 1:
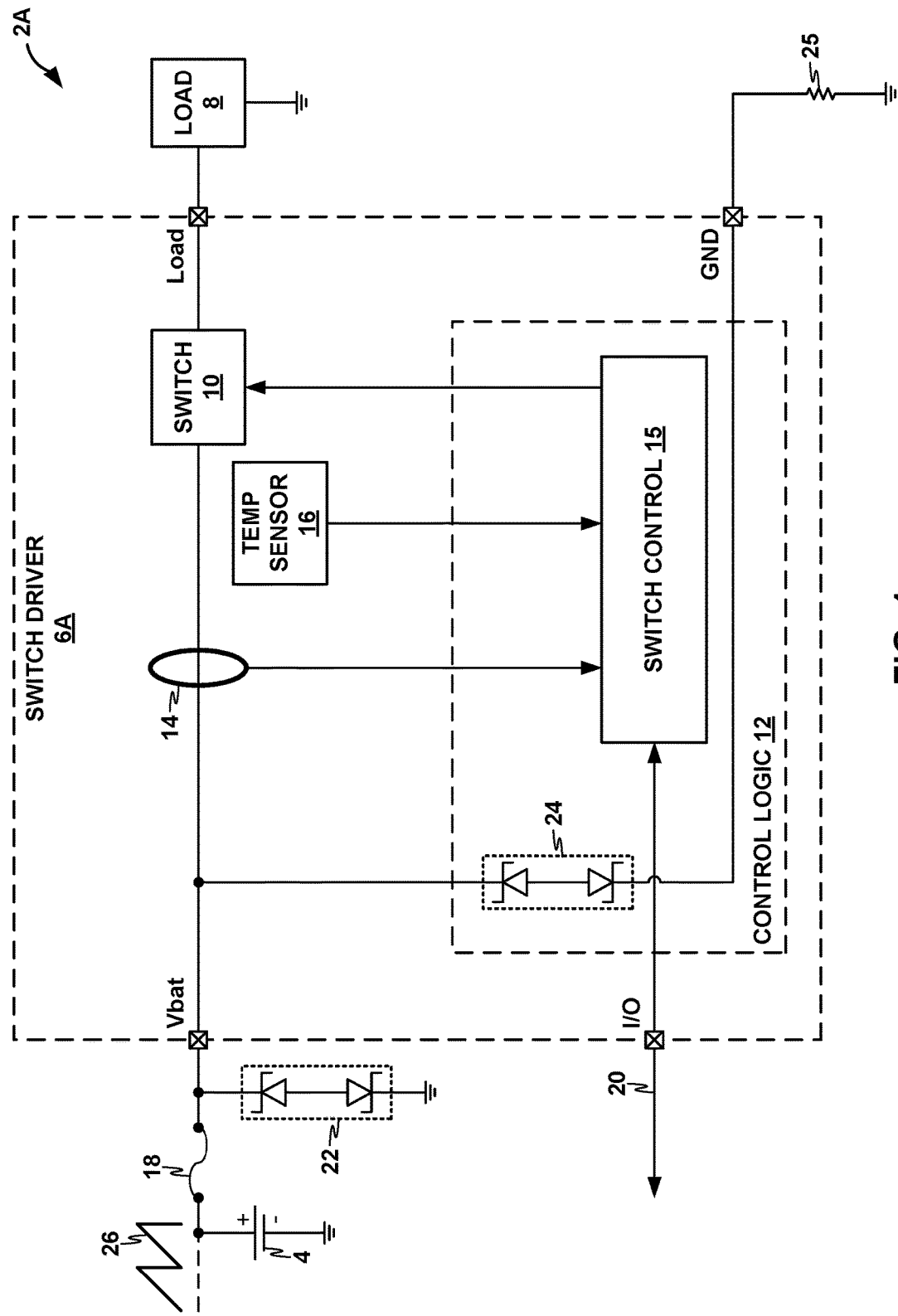
FIG. 1 is a schematic diagram illustrating an example system that includes one or more components configured to protect a switch from electrical transients, in accordance with one or more techniques of this disclosure.

FIG. 1 is a schematic diagram illustrating an example system that includes one or more components configured to protect a switch from electrical transients, in accordance with one or more techniques of this disclosure. As illustrated in FIG. 1, system 2A includes power supply 4, switch driver 6A, and load 8.

In some examples, system 2A may include power supply 4 which may be configured to provide power to one or more other components of system 2A. For instance, power supply 4 may provide power to load switch driver 6A. Examples of power supply 4 may include, but are not necessarily limited to, batteries, electrical outlets, AC/DC converters, and DC/DC converters.

In some examples, system 2A may include load 8, which may be configured to receive power from one or more components of system 2A, such as switch driver 6A. Examples of load 8 include, but are not necessarily limited to, resistive loads (e.g., incandescent lighting and electrical heaters), capacitive loads (e.g., camera flashes), and inductive loads (e.g., motors and transformers).

In some examples, system 2A may include switch driver 6A, which may be configured to control the amount of power provided to one or more components of system 2A, such as load 8. As illustrated in FIG. 1, switch driver 6A may include switch 10, control logic 12, current sensor 14, and temperature sensor 16.

Switch driver 6A may include switch 10, which may be configured to control the amount of power provided to one or more components of system 2A, such as load 8, based on a control signal received from switch control logic 12. Examples of switch 10 include, but are not necessarily limited to, power metal-oxide-semiconductor field-effect transistors (MOSFETs), double-diffused MOS (DMOS), bipolar transistors, insulated-gate bipolar transistors (IGBTs), and other such devices including Silicon-Controlled Rectifiers (SCR/GTO). In some examples, switch 10 may include a plurality of switches. In the example of FIG. 1, switch 10 is illustrated as being a high-side switch with respect to load 8. In other examples, switch 10 may be a low-side switch with respect to load 8 or may be a discrete component.

Switch driver 6A may include control logic 12, which may be configured to control operation of switch 10. Control logic 12 may be configured to communicate with one or more external devices, such as via communication channels 20. In some examples, communication channels 20 may include one or more connectors that are each configured to receive an activation signal for one or more switches included in switch 10. In some examples, communication channels 20 may include one or more connectors that are configured to couple control logic 12 to a communication bus, such as a serial peripheral interface (SPI) bus. As illustrated in FIG. 1, control logic 12 may include switch control 15 which may be configured to control operation of switch 10 based on one or more control signals received via communication channels 20.

Switch driver 6A may include current sensor 14, which may be configured to measure a level of a current of a signal provided to one or more components of switch driver 6A. As illustrated in FIG. 1, current sensor 14 may measure a level of a current of the supply signal provided to switch 10 by power supply 4. Current sensor 14 may output an indication of the measured current level to one or more components of switch driver 6A, such as control logic 12.

Switch driver 6A may include temperature sensor 16, which may be configured to measure a temperate of one or more components of switch driver 6A. As illustrated in FIG. 1, temperature sensor 16 may measure a temperature of switch 10. Temperature sensor 16 may output an indication of the measured temperature to one or more components of switch driver 6A, such as control logic 12.

System 2A may include fuse 18, which may be configured to provide overcurrent protection to one or more components of system 2A. For instance, fuse 18 may provide overcurrent protection to switch driver 6A and/or load 8.

As discussed above, it may be desirable to protect switches and driver logic from electrical transients. In the example of FIG. 1, system 2A includes clamping diodes 22, which may be configured to protect switch 10 and control logic 12 from electrical transients on the supply line, such as electrical transient 26. However, because clamping diodes 22 may, in some examples, be positioned far away from switch 10 and control logic 12, system 2A may also include clamping diodes 24 and resistor 25 to protect control logic 12 from electrical transients on the supply line, such as electrical transient 26.

Figure 2:
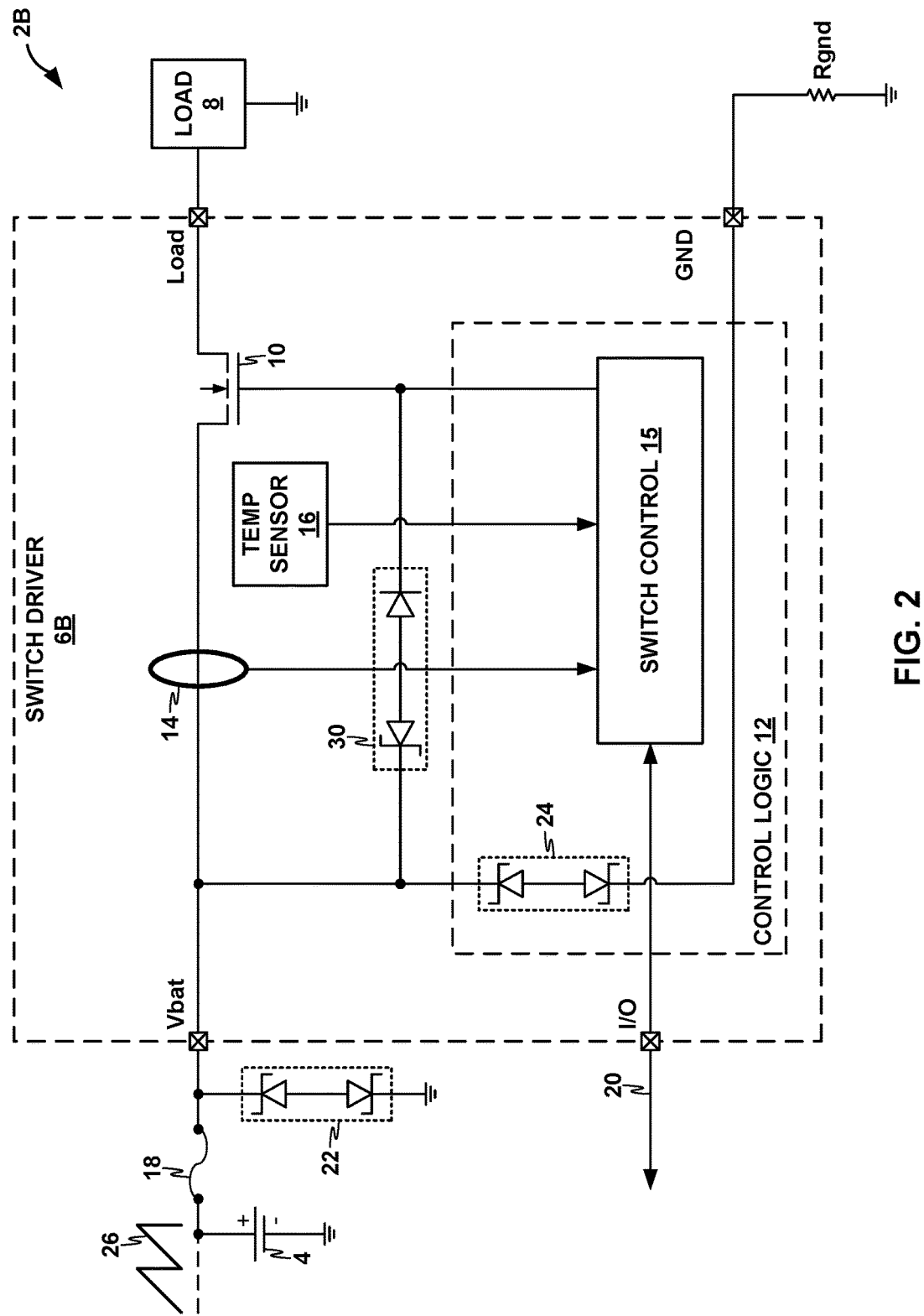
FIG. 2 is a schematic diagram illustrating an example system that includes one or more components configured to protect a switch from electrical transients, in accordance with one or more techniques of this disclosure.

FIG. 2 is a schematic diagram illustrating an example system that includes one or more components configured to protect a switch from electrical transients, in accordance with one or more techniques of this disclosure. As illustrated in FIG. 2, system 2B includes power supply 4, switch driver 6B, and load 8. Similar to system 2A, system 2B also includes clamping diodes 22, clamping diodes 24, and resistor 25 to protect control logic 12 from electrical transients on the supply line, such as electrical transient 26.

In some examples, such as where switch 10 includes a DMOS or an IGBT switch, switch 10 may not function while in avalanche breakdown, and may fail or deteriorate while in avalanche breakdown. As such, in some examples, it may be desirable to prevent switch 10 from entering breakdown entirely. As illustrated in FIG. 2, a "gate clamping" technique may be implemented in which switch driver 6B includes one or more diodes 30 electrically positioned between the gate/base and a drain/collector of switch 10 (the terminology depending on a technology of switch 10). In the "gate clamping" technique, diodes 30 may enable the gate of switch 10 in response to a drain/collector or a gate/base overvoltage. In this way, the diodes 30 may prevent switch 10 from entering avalanche breakdown.

However, the "gate clamping" technique comes with one or more disadvantages. As one example, when using the "gate clamping" technique, the switch does not work in the lowest Rds-ON/Rce-ON value during supply line transients, such as transient 26, causing high power dissipation, wear out and deterioration until the damage of switch 10. As such, the "gate clamping" technique may not guarantee a reliable protection. As another example, in examples where switch driver 6B includes multiple switches and a separate set of clamping diodes for each switch, the threshold of each of the clamping diodes may be similar but not the same. As such, the switch with lower Rds-ON/Rce-ON value enabled by the "gate clamping" will dissipate most of the energy of the supply line transient and have a higher probability of damage during supply line transients.

In some examples, such as where switch 10 includes a FET switch, switch 10 may function while in avalanche breakdown. However, allowing switch 10 to operate in avalanche breakdown comes with one or more disadvantages. As one example, depending on the energy dissipated, switch 10 may deteriorate and fail over time. An example of how avalanche breakdown may cause a switch to deteriorate and fail over time is described below with reference to FIG. 4. As another example, in examples where switch driver 6B includes multiple switches, the avalanche breakdown voltage threshold of each of the switches may be similar but not the same and may also depend on their respective loads. As such, one or more of the switches may enter breakdown conduction before the others and the switch or switches that enter breakdown conduction will dissipate most of the energy of the supply line transient. Moreover, the load affects the amount of energy dissipated by the switches, making some switches more prone to failure than others.

Figure 3:
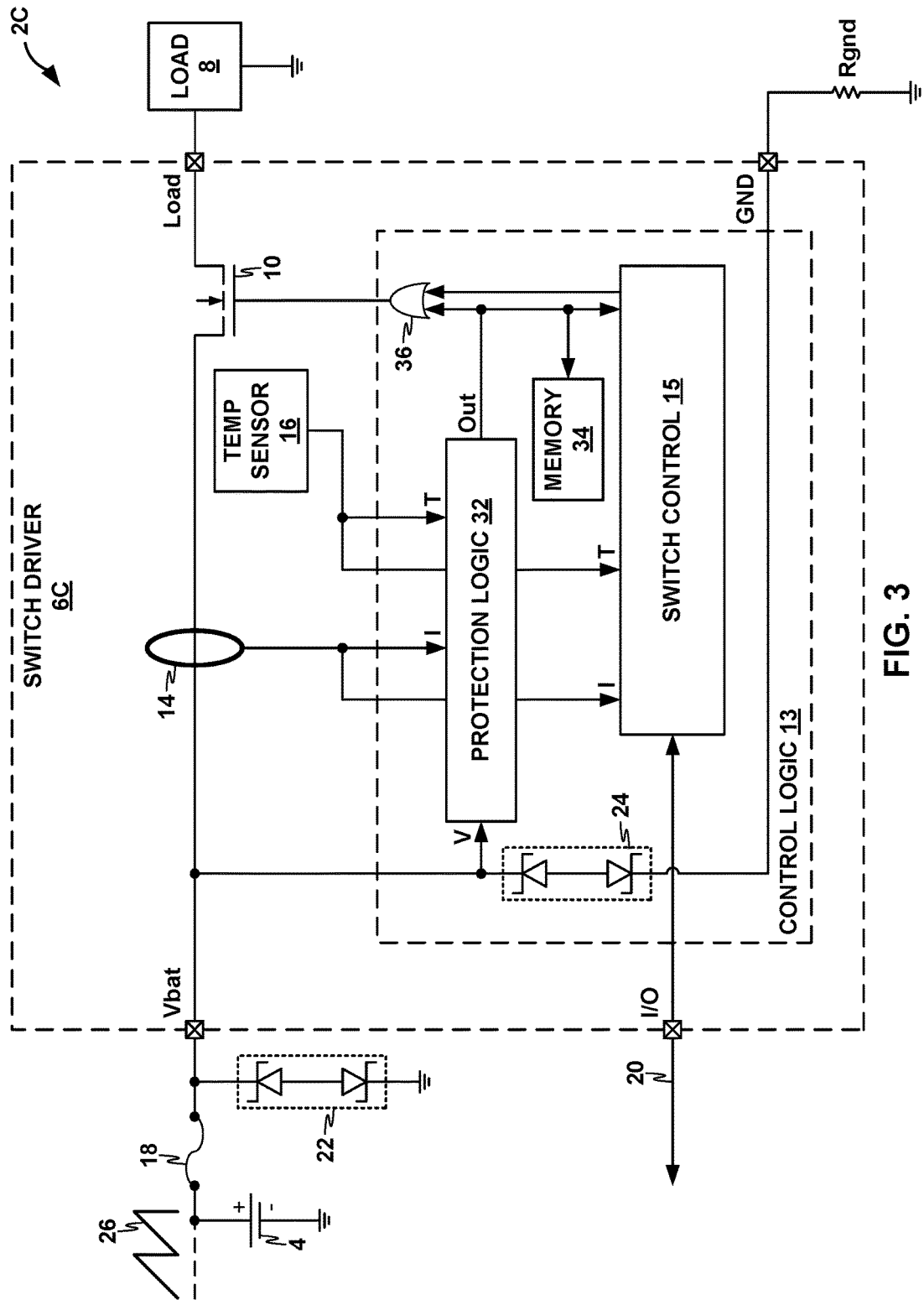
FIG. 3 is a schematic diagram illustrating an example system that includes one or more components configured to protect a switch from electrical transients, in accordance with one or more techniques of this disclosure.

FIG. 3 is a schematic diagram illustrating an example system that includes one or more components configured to protect a switch from electrical transients, in accordance with one or more techniques of this disclosure. As illustrated in FIG. 3, system 2C includes power supply 4, switch driver 6C, and load 8. Similar to systems 2A and 2B, system 2C may include clamping diodes 22, clamping diodes 24, and resistor 25 to protect control logic 12 from electrical transients on the supply line, such as electrical transient 26.

System 2C, in some examples, includes control logic 13, which may be configured to perform operations similar to control logic 12. For instance, control logic 13 may be configured to control operation of switch 10. As illustrated in FIG. 3, control logic 13 may include switch 15 which may be configured to control operation of switch 10 based on one or more control signals received via communication channels 20. Additionally, as illustrated in FIG. 3, control logic 13 may include protection logic 32, memory 34, and OR gate 36.

In accordance with one or more techniques of this disclosure, control logic 13 may include protection logic 32, which may be configured to activate a switch, such as switch 10, based on detecting an incoming supply transient. As one example, the control logic may activate the switch immediately in response to detecting the incoming supply transient. As another example, the control logic may briefly delay activation of the switch to tolerate limited avalanche breakdown while avoid destruction of the switch. By activating a switch in this way, the control logic may reduce the amount of power dissipated by the switch, which may improve the robustness and extend the lifetime of the switch.

In some examples, protection logic 32 may detect the incoming transient based on one or more electrical characteristics of the power signal provided to switch 10. Some example electrical characteristics include, but are not necessarily limited to, a voltage level (i.e., potential) of the signal (V), and a current level of the signal (I). In some examples, protection logic 32 may detect the incoming transient based on parameters calculated based on one or more electrical characteristics of the power signal provided to switch 10. For instance, protection logic 32 may detect the incoming transient based on amount of power dissipated by switch 10 calculated based on a current of the power signal. In some examples, protection logic 32 may determine when to activate switch 10 based on a temperature (T) of switch 10 received from temperature sensor 16. In any case, based on detecting an incoming supply transient, protection logic 32 may output a signal (Out) to one or more components of switch driver 6C, such as OR gate 36.

In some examples, control logic 13 may include memory 34, which may be configured to store an indication that an electrical transient event has occurred. For instance, in response to receiving a signal from protection logic 32 to activate switch 10, memory 34 may increment a counter that indicates how electrical transient events have occurred. In this way, memory 34 may store information which may be used to monitor performance and/or perform failure analysis of switch driver 6C.

In some examples, control logic 13 may include OR gate 36, which may be configured to activate switch 10 in response to either a signal from protection logic 32 or switch control 15. For instance, even if switch control 15 is not outputting a signal to request activation of switch 10, OR gate 36 may still activate switch 10 in response to receiving a signal from protection logic 32.

Although not illustrated in FIG. 3, in some examples, switch driver 6C may include one or more components configured to implement the above-described "gate clamping" technique. For instance, switch driver 6C may include one or more diodes 30 electrically positioned between a drain and a collector or a gate and a base of switch 10 (the terminology depending on a technology of switch 10).

Figure 4A:
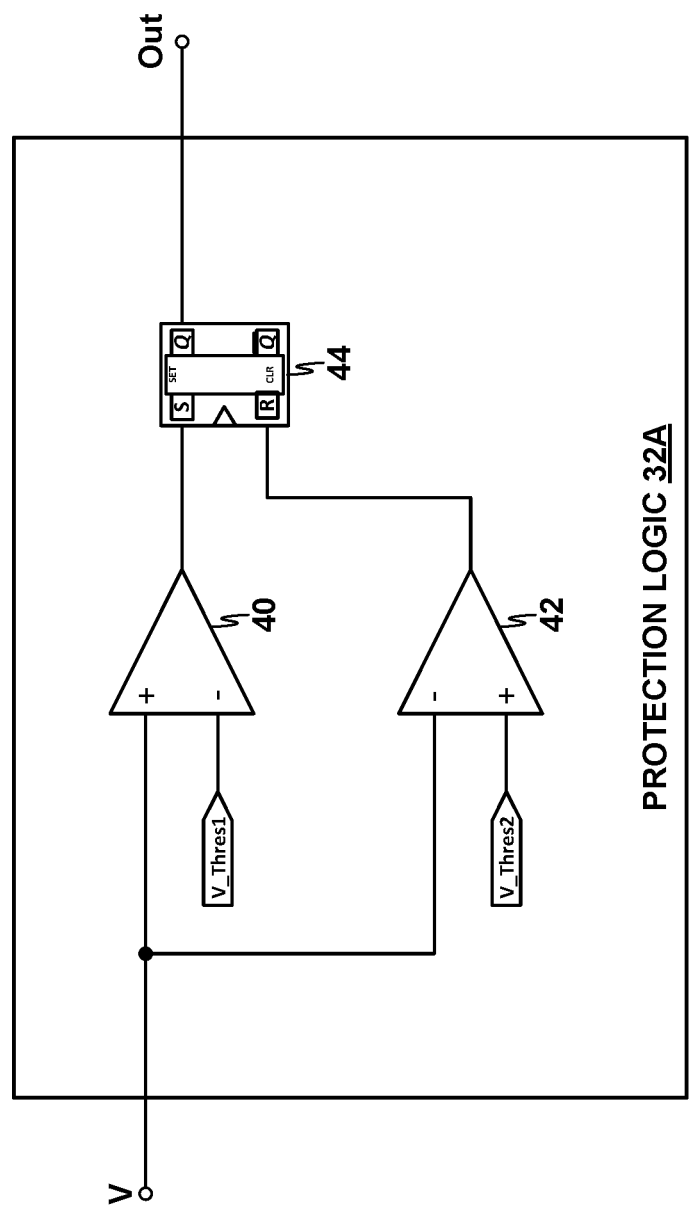
FIGS. 4A-4C are schematic diagrams respectively illustrating examples of protection logic that are configured to activate a switch based on detecting an electrical transient, in accordance with one or more techniques of this disclosure.
Figure 4B:
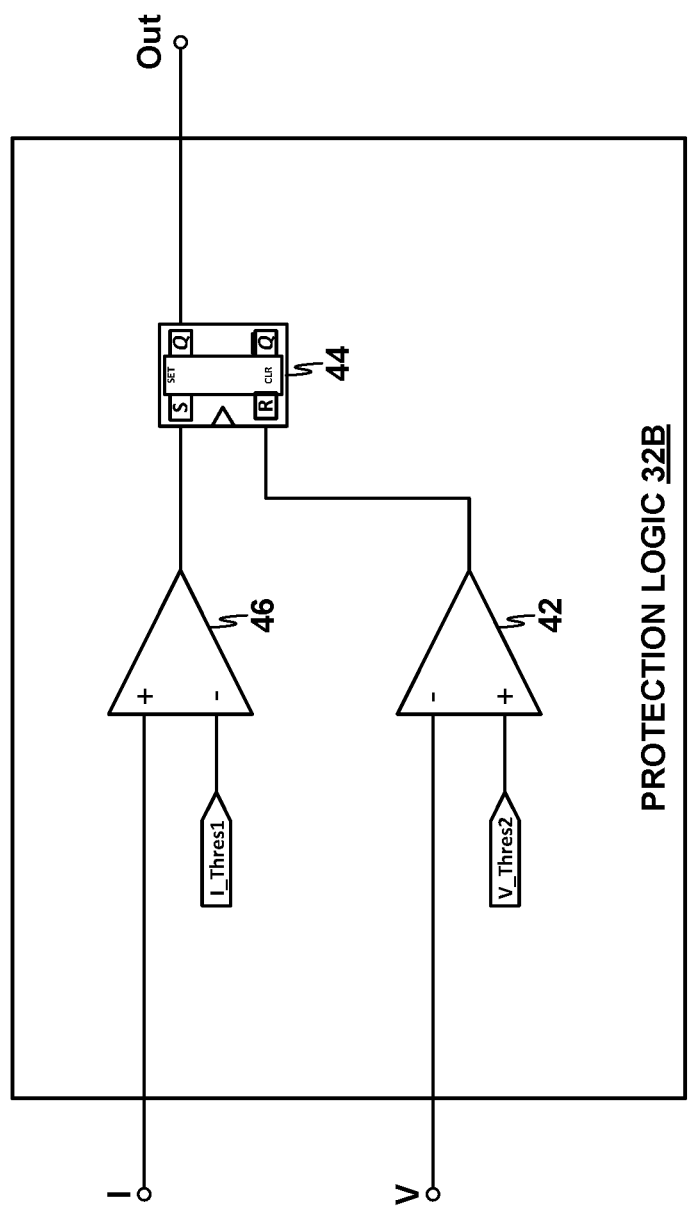
Figure 4C:
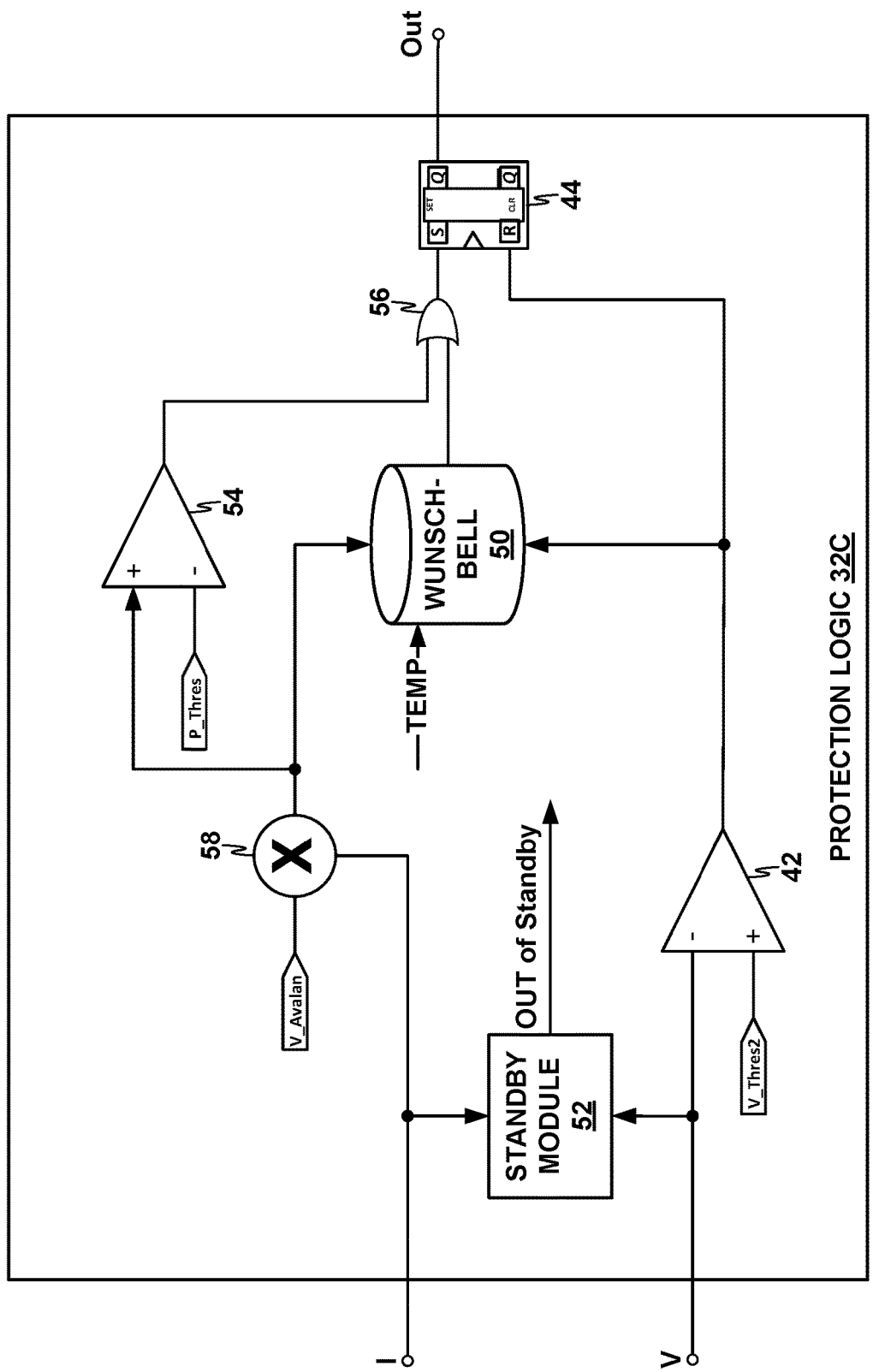

FIGS. 4A-4C are schematic diagrams respectively illustrating examples of protection logic 32A-32C that are configured to activate a switch based on detecting an electrical transient, in accordance with one or more techniques of this disclosure. FIG. 4A illustrates protection logic 32A, which may be configured to activate a switch in response to determining that voltage level of a signal provided to the switch satisfies a voltage threshold until determining that the voltage level of the signal provided to the switch satisfies a threshold potential. As illustrated in FIG. 4A, protection logic 32A may include comparator 40, comparator 42 and flip-flop 44.

Protection logic 32A may include comparator 40, which may be configured to output a signal indicating which input is greater. In the example of FIG. 4A, comparator 40 may output a signal that indicates whether or not the voltage level of the supply line (V) is greater than a first threshold (V_Thres1). For instance, comparator 40 may output a logic high to flip-flip 44 if the voltage level of the supply line (V) is greater than the first threshold (V_Thres1) or output a logic low to flip-flip 44 if the voltage level of the supply line (V) is less than the first threshold (V_Thres1).

Protection logic 32A may include comparator 42, which may be configured to output a signal indicating which input is greater. In the example of FIG. 4A, comparator 42 may output a signal that indicates whether or not the voltage level of the supply line (V) is greater than a second threshold (V_Thres2). For instance, comparator 42 may output a logic low to flip-flip 44 if the voltage level of the supply line (V) is greater than the second threshold (V_Thres2) or output a logic high to flip-flip 44 if the voltage level of the supply line (V) is less than the second threshold (V_Thres2).

Protection logic 32A may include flip-flop 44, which may be configured to store state information. In the example of FIG. 4A, flip-flop 44 may be an SR latch. When flip-flop 44 receives a logic high signal from comparator 40 at the set terminal (S), flip-flop 44 may set the logic level of output terminal (Q) to high. When flip-flop 44 receives a logic high signal from comparator 42 at the reset (R) terminal, flip-flop 44 may reset the logic level of output terminal Q to low.

In some examples, protection logic 32A may include a hysteresis comparator as opposed to comparator 40, comparator 42, and flip-flop 44. In this way, the implementation cost of these techniques may be reduced.

Referring to FIGS. 3 and 4A, in operation, a transient may occur on the supply line while switch 10 is off (deactivated). The transient may cause the voltage level for the supply line to increase. Comparator 40 may determine that the voltage level of the supply line satisfies the first voltage threshold (i.e., is greater than the first voltage threshold) and output a logic high signal to the set terminal of flip-flop 44. The first voltage threshold may be set to be greater than an absolute maximum rating of switch 10 but less than a breakdown voltage of switch 10.

In response to receiving the signal indicating that the voltage level of the supply line satisfies the first voltage threshold, flip-flop 44 may output a logic high signal from output terminal Q to OR gate 36, which may activate switch 10. The activation of switch 10 may allow the transient to pass through switch 10 without inflicting damage.

As a result of activating switch 10, the voltage level of the supply line may decrease. Once the voltage level of the supply line satisfies the second voltage threshold (V_Thres2) (i.e., is less than the second voltage threshold), comparator 42 may output a logic high signal to flip-flop 44. The second voltage threshold may be set to be less than the first voltage threshold. In response to receiving the signal indicating that the voltage level of the supply line satisfies the second voltage threshold, flip-flop 44 may output a logic low signal from output terminal Q to OR gate 36, which may deactivate switch 10 (unless switch control 15 is outputting a signal to activate switch 10).

FIG. 4B illustrates protection logic 32B, which may be configured to activate a switch in response to determining that current level of a signal provided to the switch satisfies a current threshold until determining that a voltage level of the signal provided to the switch satisfies a threshold potential. As illustrated in FIG. 4B, protection logic 32B may include comparator 42, flip-flop 44, each of which may be configured to perform operations similar to comparator 42 and flip-flop 44 of FIG. 4A.

As illustrated in FIG. 4B, protection logic 32B may include comparator 46, which may be configured to output a signal indicating which input is greater. In the example of FIG. 4B, comparator 46 may output a signal that indicates whether or not the current level of the supply line (I) is greater than a first threshold (I_Thres1). For instance, comparator 46 may output a logic high to flip-flip 44 if the current level of the supply line (I) is greater than the first threshold (I_Thres1) or output a logic low to flip-flip 44 if the current level of the supply line (I) is less than the first threshold (I_Thres1).

Referring to FIGS. 3 and 4B, in operation, a transient may occur on the supply line while switch 10 is off (deactivated). Normally, while switch 10 is off, the current measured by current sensor 14 should zero. However, the transient may cause the current level for the supply line to increase above zero (e.g., the transient voltage may exceed the avalanche breakdown voltage of the switch 10, which may cause current to flow through switch 10). Comparator 40 may monitor the current level measured by current sensor 14 while switch 10 is off and output a logic high signal to the set terminal of flip-flop 44 in response to determining that the current level of the supply like satisfies a current threshold (i.e., is greater than the current threshold). The current threshold may be set to be greater than zero.

In response to receiving the signal indicating that the current level of the supply line satisfies the current threshold, flip-flop 44 may output a logic high signal from output terminal Q to OR gate 36, which may activate switch 10. The activation of switch 10 may allow the transient to pass through switch 10 without inflicting damage.

As a result of activating switch 10, the voltage level of the supply line may decrease. Once the voltage level of the supply line satisfies the second voltage threshold (V_Thres2) (i.e., is less than the second voltage threshold), comparator 42 may output a logic high signal to flip-flop 44. The second voltage threshold may be set to be less than the voltage threshold of the avalanche breakdown of switch 10. In response to receiving the signal indicating that the voltage level of the supply line satisfies the second voltage threshold, flip-flop 44 may output a logic low signal from output terminal Q to OR gate 36, which may deactivate switch 10 (unless switch control 15 is outputting a signal to activate switch 10).

FIG. 4C illustrates protection logic 32C, which may be configured to activate a switch in response to determining that the amount of power dissipated by the switch is about to damage the switch until determining that a voltage level of a signal provided to the switch satisfies a threshold potential. As illustrated in FIG. 4C, protection logic 32C may include comparator 42, flip-flop 44, each of which may be configured to perform operations similar to comparator 42 and flip-flop 44 of FIG. 4A.

Protection logic 32C may include standby module 52, which may be configured to transition protection logic 32C out of a standby mode in response to determining that one or both of a voltage level (V) of a signal provided to switch 10 is greater than a voltage threshold or a current level of the signal provided to switch 10 is greater than a current threshold. In some examples, standby module 52 may include a comparator similar to comparator 40 of FIG. 4A to determine whether the voltage level (V) of the signal provided to switch 10 is greater than the voltage threshold and/or a comparator similar to comparator 46 of FIG. 4B to determine whether the current level of the signal provided to switch 10 is greater than the current threshold. The voltage threshold may be less than a breakdown voltage of switch 10 and greater than an absolute maximum voltage rating of switch 10 (V_breakdown_AMR). In some examples, standby module 52 may output a signal to one or more components of protection logic 32C, such as Wunsch-Bell module 50, to turn the protection logic 32C out of the standby mode.

Protection logic 32C may include power dissipation module 58, which may be configured to determine an amount of power dissipated by a switch. For instance, power dissipation module 58 may determine an amount of power dissipated by switch 10 based on an avalanche breakdown voltage of switch 10 (i.e., V_Avalan) and a level of a current flowing through switch 10 (i.e., I). Power dissipation module 58 may output an indication of the amount of power dissipated by switch 10 to one or more components of protection logic 32C, such as Wunsch-Bell module 50 and/or comparator 54.

Protection logic 32C may include Wunsch-Bell module 50, which may be configured to determine whether a switch has incurred or will incur damage based on Wunsch-Bell characteristics of the switch, a temperature of the switch, an amount of power dissipated by the switch, and an amount of time that the switch dissipated the amount of power. Wunsch Bell characteristics are based on the theory that high-amplitude, short-duration transient pulses may cause the destruction of an electronic component and the amount of damage caused to a semiconductor device due to a transient pulse or overvoltage condition, can be predicted using the Wunsch Bell electrical overstress model. According to the model, along with the peak voltage and current incurred in a device, the pulse duration of an overvoltage condition is important in determining the amount of power required to cause a bipolar junction to fail. Further details of Wunsch-Bell module 50 are discussed below with reference to FIG. 5.

Protection logic 32C may include comparator 54, which may be configured to output a signal indicating which input is greater. In the example of FIG. 4C, comparator 54 may output a signal that indicates whether or not the amount of power dissipated by switch 10 is greater than a power threshold (P_Thres). For instance, comparator 54 may output a logic high to OR gate 56 if the amount of power dissipated by switch 10 is greater than the power threshold or output a logic low to OR gate 56 if the amount of power dissipated by switch 10 is less than the power threshold.

Protection logic 32C may include OR gate 56, which may be configured to activate switch 10 in response to either a signal from protection logic 32 or switch control 15. For instance, even if switch control 15 is not outputting a signal to request activation of switch 10, OR gate 36 may still activate switch 10 in response to receiving a signal from protection logic 32.

Figure 5:
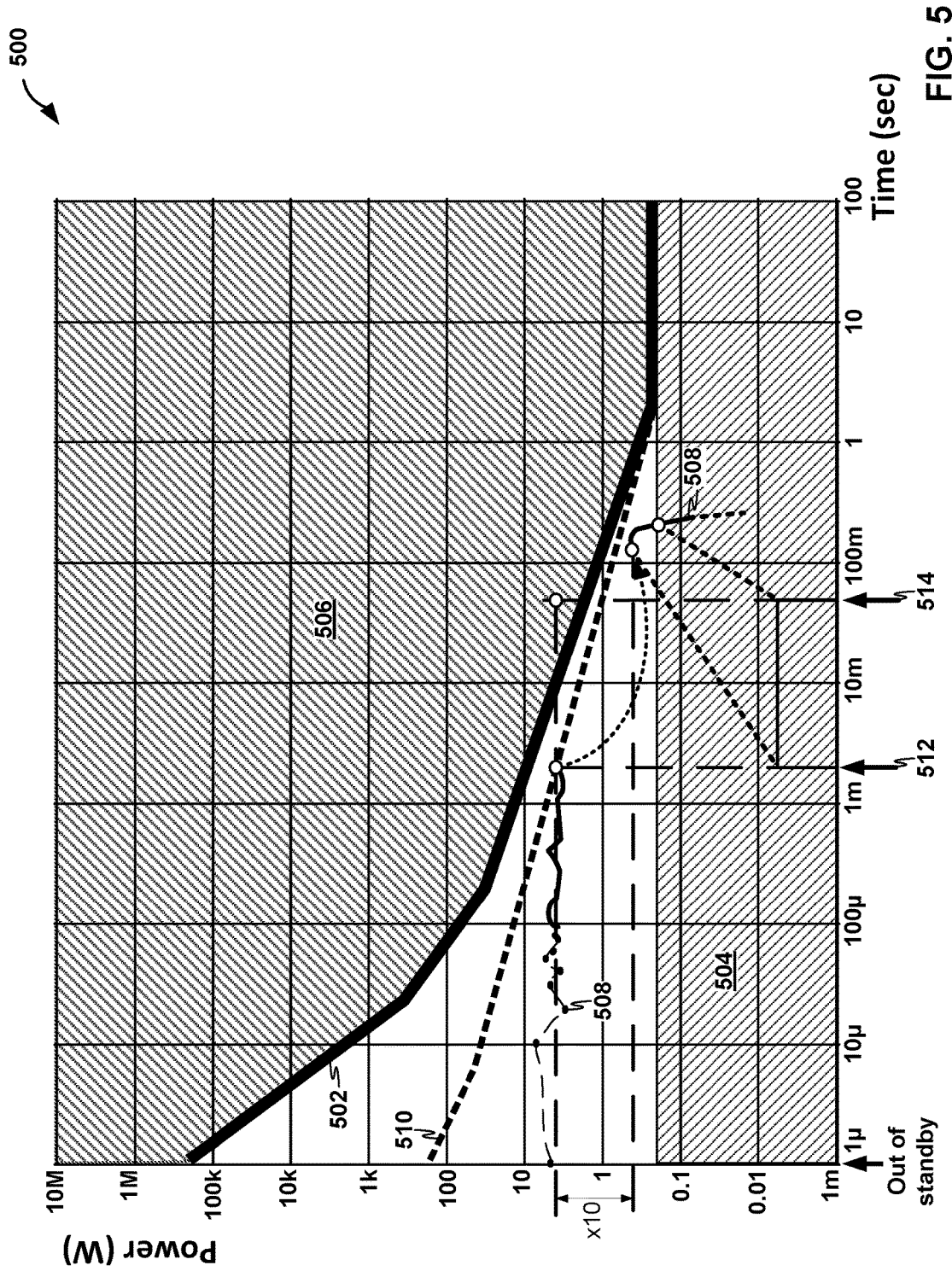
FIG. 5 is a graph illustrating example Wunsch-Bell characteristics of a switch, in accordance with one or more techniques of this disclosure.

FIG. 5 is a graph illustrating example Wunsch-Bell characteristics of a switch, in accordance with one or more techniques of this disclosure. As illustrated in FIG. 5, graph 500 includes a horizontal axis representing time with a logarithmic scale, a vertical axis representing power with a logarithmic scale, plot 502 representing a destruction limit of a switch at a particular temperature, and plot 508 representing an amount of power dissipated by the switch. For instance, plot 502 may represent a destruction limit of switch 10 at 25 degrees Celsius. Region 504 of graph 500 represents a safe operating area (SOA) in which the switch may dissipate power indefinitely without incurring damage. Region 506 of graph 500, the area above plot 502, represents an area in which the switch is incurring damage. For instance, a transient that causes a switch to dissipate 0.1 watts (W) of power for 10 seconds will fall within region 504 and not cause damage to the switch. Similarly, a transient that causes a switch to dissipate 1 W of power for 10 seconds will fall within region 506 and will cause damage to the switch.

Referring to FIGS. 3, 4B, and 5, in operation, a transient may occur on the supply line while switch 10 is off (deactivated). Normally, while switch 10 is off, the current measured by current sensor 14 should zero and the voltage of the supply line should be less than a voltage threshold. However, the transient may cause the current level for the supply line to increase above zero and/or the voltage of the supply line to increase about the threshold. In response to one or both of a voltage level (V) of the supply line being greater than the voltage threshold or the current level of the supply line being greater than the current threshold, standby module 52 may transition protection logic 32C out of a standby mode. For instance, standby module 52 may output a signal to Wunsch-Bell module 50 indicating that a transient has been detected.

In response to receiving the signal that the transient has been detected, Wunsch-Bell module 50 may monitor the amount of power dissipated by switch 10 (represented by plot 508 over time). Time zero ("Out of standby") on FIG. 5 may correspond to the time at which the transient is detected by protection logic 32C. Wunsch-Bell module 50 may determine whether switch 10 has incurred or will incur damage based on Wunsch-Bell characteristics of switch 10. For instance, Wunsch-Bell module 50 may determine, based on a temperature of switch 10 and one or more Wunsch-Bell characteristics of switch 10, a power-time threshold for switch 10. In the example of FIG. 5, Wunsch-Bell module 50 may determine power-time threshold 510, also referred to as turn-on threshold 510.

Wunsch-Bell module 50 may determine that switch 10 will incur damage based on the amount of time for which switch 10 has been dissipating the amount of power satisfying power-time threshold 510. As shown in FIG. 5, Wunsch-Bell module 50 may determine that switch 10 will incur damage at time 512. In response to determining that switch 10 will incur damage, Wunsch-Bell module 50 may output a signal, such as a logic high signal to OR gate 56 or set terminal (S) of flip-flop 44.

In response to receiving the signal indicating that switch 10 will incur damage, flip-flop 44 may output a logic high signal from output terminal Q to OR gate 36, which may activate switch 10. The activation of switch 10 may allow the transient to pass through switch 10 without inflicting damage.

As a result of activating switch 10, the voltage level of the supply line may decrease. At time 514, the voltage level of the supply line may satisfy a second voltage threshold (V_Thres2) (i.e., drop below less than the second voltage threshold). In response to determining that the voltage level of the supply line satisfies the second voltage threshold, comparator 42 may output a logic high signal to flip-flop 44. The second voltage threshold may be set to be less than the first voltage threshold used by standby module 52. In response to receiving the signal indicating that the voltage level of the supply line satisfies the second voltage threshold, flip-flop 44 may output a logic low signal from output terminal Q to OR gate 36, which may deactivate switch 10 (unless switch control 15 is outputting a signal to activate switch 10).

Additionally, the activation of switch 10 may cause the amount of power dissipated by switch 10 to decrease. In the example of FIG. 5, the amount of power dissipated by switch 10 may decrease by a factor of ten. As shown in FIG. 5, this decrease in power dissipation increases the robustness of switch 10 because the transient duration before damage is incurred (i.e., before the power dissipated by switch 10 crosses into region 506) is increased.

Figure 6:
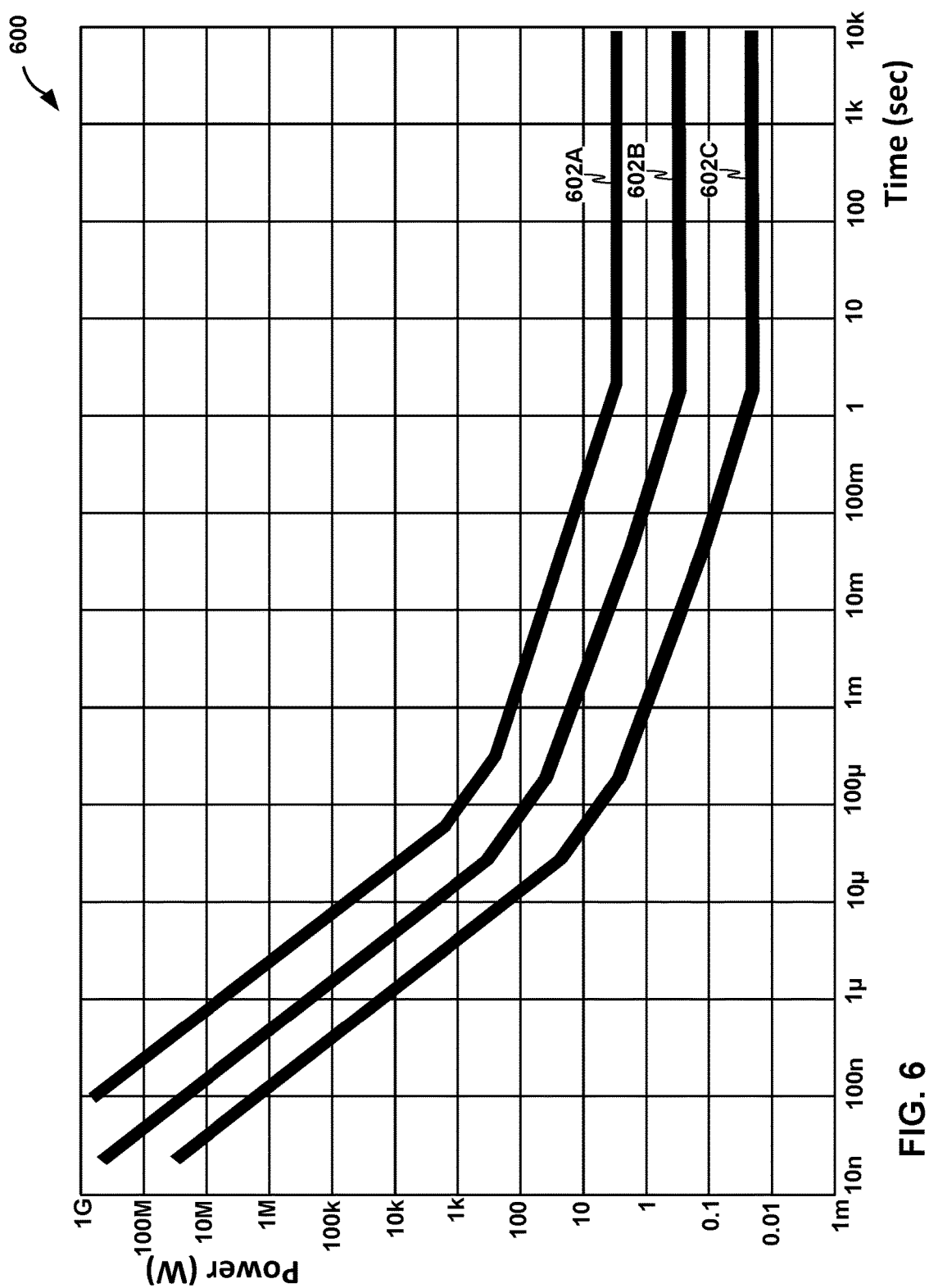
FIG. 6 is a graph illustrating example Wunsch-Bell characteristics of a switch, in accordance with one or more techniques of this disclosure.

FIG. 6 is a graph illustrating example Wunsch-Bell characteristics of a switch, in accordance with one or more techniques of this disclosure. As illustrated in FIG. 6, graph 600 includes a horizontal axis representing time with a logarithmic scale, a vertical axis representing power with a logarithmic scale, plots 602A-602C representing destruction limits of a switch at different temperatures. For instance, plot 602A may represent a destruction limit of switch 10 at 40 degrees Celsius, plot 602B may represent a destruction limit of switch 10 at 60 degrees Celsius, and plot 602C may represent a destruction limit of switch 10 at 80 degrees Celsius.

As discussed above, Wunsch-Bell module 50 of FIG. 4C may determine whether switch 10 has incurred or will incur damage. As shown in FIG. 6, the Wunsch-Bell characteristics, and the destruction limits, of a switch may change based on the temperature of the switch. As such, in accordance with one or more techniques of this disclosure, Wunsch-Bell module 50 may determine whether switch 10 has incurred or will incur damage based on a temperature of switch 10.

Figure 7:
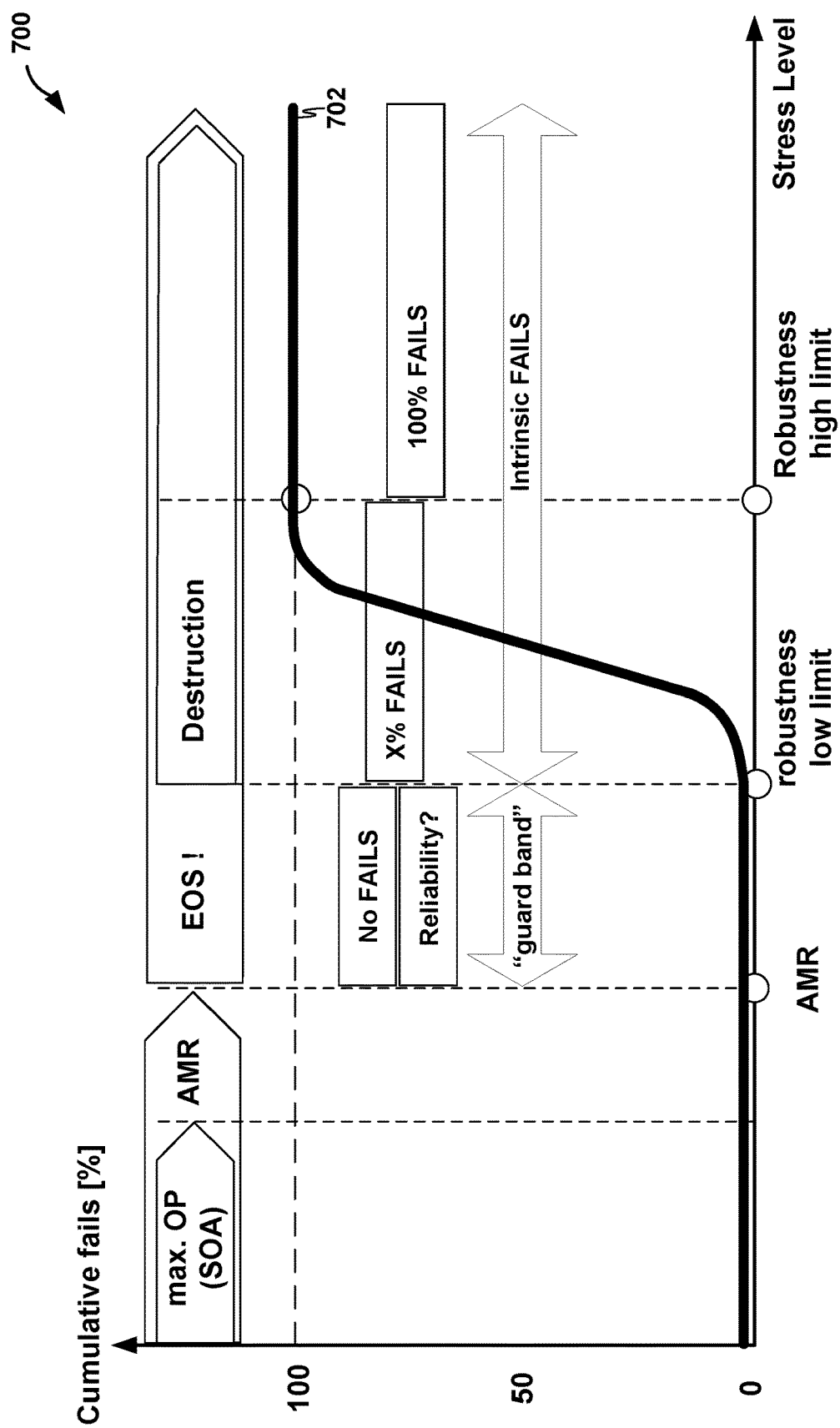
FIG. 7 is a graph illustrating example effects of stress on a device, in accordance with or more techniques of this disclosure.

FIG. 7 is a graph illustrating example effects of stress on a device, in accordance with or more techniques of this disclosure. As illustrated in FIG. 7, graph 700 includes a horizontal axis representing the stress levels, a vertical axis representing failure rate, and plot 702 representing a relationship between stress levels to which a device has been subjected and failure rates of the device.

As shown by plot 702, the failure rate of a device does not increase so long as the device is not subjected to stress levels outside of a safe operating area (SOA) of the device. Additionally, though correct operation is not guaranteed, the failure rate of the device does not increase so long as the device is not subjected to stress levels above an absolute maximum rating (AMR) of the device.

Stress levels above the AMR but smaller than the "low limit robustness" place the device in the electrical overstress (EOS) zone "Electrical Overstress" in which the device should not get broken, but survival of the device is not guaranteed and normally the device is wearing out as a result of the stress levels. As such, repetitive exposure to stress levels over the AMR will lead to a degradation and finally to damage of the device.

Once the device is subjected to stress levels greater than the "low limit robustness", there is a known probability of device failure. Additionally, if the device is subjected to stress levels greater than the "high limit robustness", the probability of failure is 100%.

In case of exceeding of the AMR, it may be desirable to minimize the amount of energy dissipated by a device in order to maximize the robustness of the device. As discussed above and in accordance with one or more techniques of this disclosure, a protection logic may activate a device in response to detecting a transient on a supply line to the device. For instance, protection logic 32 of FIG. 3 may activate switch 10 in response to detecting transient 26. In this way, the techniques of this disclosure may reduce the amount of energy dissipated by devices, which may increase the robustness of the devices.

Figure 8:
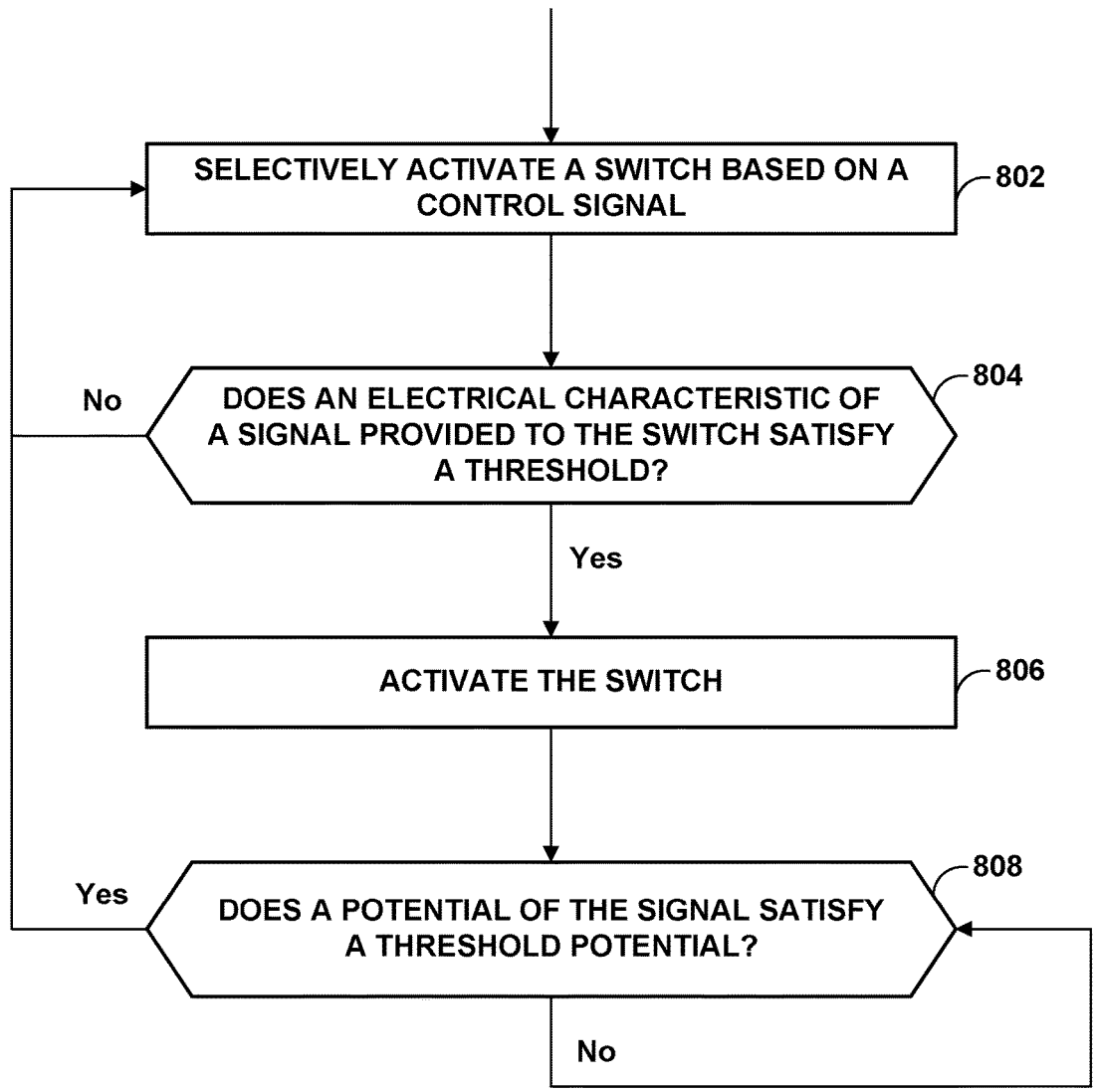
FIG. 8 is a flow diagram illustrating an example technique for protecting a switch from damage, in accordance with one or more techniques of this disclosure.

FIG. 8 is a flow diagram illustrating an example technique for protecting a switch from damage, in accordance with one or more techniques of this disclosure. For purposes of illustration only, the example operations are described below within the context of switch driver 6C, as shown in FIG. 3, though devices other than switch driver 6C may perform the techniques of FIG. 8.

Switch driver 6C may selectively activate switch 10 based on a control signal (802). As one example, in response to receiving a control signal via communication channels 20 requesting activation of switch 10, switch control 15 may output a logic high signal to OR gate 36 to cause switch 10 to activate. As another example, in response to receiving a control signal via communication channels 20 requesting deactivation of switch 10, switch control 15 may output a logic low signal to OR gate 36 to cause switch 10 to deactivate.

In accordance with one or more techniques of this disclosure, switch driver 6C may determine whether an electrical characteristic of a signal provided to switch 10 satisfies a threshold (804). As one example, protection logic 32 of switch driver 6C may determine that the electrical characteristic of the signal provided to switch 10 satisfies the threshold in response to determining that the potential (V) of the signal satisfies a threshold potential (e.g., V_Thres1 of FIG. 4A). As another example, protection logic 32 may determine that the electrical characteristic of the signal provided to switch 10 satisfies the threshold in response to determining that a current level (I) of the signal satisfies a current level threshold (e.g., I_Thres1 of FIG. 4B). As another example, protection logic 32 may determine that the electrical characteristic of the signal provided to switch 10 satisfies the threshold in response to determining that an amount of power dissipated by switch 10 is about to inflict damage to switch 10 (i.e., is greater than a power dissipation threshold).

If the electrical characteristic of the signal does not satisfy the threshold ("No" branch of 804), switch driver 6C may continue to selectively activate switch 10 based on the control signal (802). However, if the electrical characteristic of the signal does satisfy the threshold ("Yes" branch of 804), switch driver 6C may activate switch 10 (806). For instance, in response to determining that the electrical characteristic of the signal does satisfy the threshold, protection logic 32 may output a logic high signal to OR gate 36, which may cause switch 10 to activate regardless of whether switch control 15 is requesting activation of switch 10.

In some examples, switch driver 6C may store and/or output an indication that an electric transient event has occurred. As one example, memory 34 of switch driver 6C may store an indication that the switch was activated due to an occurrence of an electric transient event. As another example, switch control 15 may output, to an external device and via communication channels 20, an indication that the switch was activated due to an occurrence of an electric transient event.

Switch driver 6C may determine whether a potential of the signal satisfies a threshold potential (808). For instance, comparator 42 of protection logic 32 may determine whether the potential of the signal is less than a threshold potential (e.g., V_Thres2 of FIGS. 4A-4C).

If the potential of the signal does not satisfy the threshold potential ("No" branch of 808), switch driver 6C may continue to monitor the signal to determine whether the potential of the signal satisfies the threshold potential (808). If the potential of the signal satisfies the threshold potential ("Yes" branch of 808), switch driver 6C may resume selectively activating switch 10 based on the control signal (802). For instance, if the potential of the signal satisfies the threshold potential and the control signal does not request activation of switch 10, switch driver 6C may deactivate switch 10.

In this way, the techniques of this disclosure may reduce the amount of transient-induced power dissipated by a switch. By reducing the amount of transient-induced power dissipated by a switch, the techniques of disclosure may improve the robustness and longevity of the switch.

The following numbered examples may illustrate one or more aspects of the disclosure:

Example 1

A method comprising: selectively activating, by control logic and based on a control signal, a switch; in response to determining that an electrical characteristic of a signal provided to the switch satisfies a threshold while the switch is deactivated, activating, by the control logic and regardless of the control signal, the switch until determining that a potential of the signal provided to the switch satisfies a threshold potential; and in response to determining that the potential of the signal provided to the switch satisfies the threshold potential, deactivating the switch.

Example 2

The method of example 1, wherein the threshold potential is a second threshold potential, and wherein determining that the electrical characteristic of the signal provided to the switch satisfies the threshold comprises: determining that the electrical characteristic of the signal provided to the switch satisfies the threshold in response to determining that the potential of the signal satisfies a first threshold potential that is greater than the second threshold potential.

Example 3

The method of example 2, wherein the first threshold potential is less than or equal to a breakdown voltage of the switch.

Example 4

The method of any combination of examples 1-3, wherein determining that the electrical characteristic of the signal provided to the switch satisfies the threshold comprises: determining that the electrical characteristic of the signal provided to the switch satisfies the threshold in response to determining that a current level of the signal satisfies a current level threshold.

Example 5

The method of any combination of examples 1-4, wherein the threshold potential is less than or equal to a breakdown voltage of the switch.

Example 6

The method of any combination of examples 1-5, further comprising: determining, based on a current level of the signal, an amount of power dissipated by the switch; determining, based on a temperature of the switch and one or more Wunsch-Bell characteristics of the switch, a power-time threshold for the switch; determining that the electrical characteristic of the signal provided to the switch satisfies the threshold in response to determining that an amount of time for which the switch has been dissipating the amount of power satisfies the power-time threshold for the switch.

Example 7

The method of any combination of examples 1-6, further comprising: determining the power-time threshold for the switch based on one or more Wunsch-Bell characteristics of the switch.

Example 8

The method of any combination of examples 1-7, wherein the control logic is included in a switch driver, the method further comprising: in response to determining that the electrical characteristic of the signal provided to the switch satisfies the threshold while the switch is deactivated, one or both of: storing, by a memory device included in the switch driver, an indication that an electric transient event has occurred; and outputting, by the control logic and to a device external to the switch driver, an indication that an electric transient event has occurred.

Example 9

The method of any combination of examples 1-8, wherein the signal is provided to a plurality of switches, and wherein activating the switch in response to determining that the electrical characteristic of the signal provided to the switch satisfies the threshold until determining that the potential of the signal provided to the switch satisfies the threshold potential comprises: activating the plurality of switches in response to determining that the electrical characteristic of the signal provided to the plurality of switches satisfies the threshold until determining that the potential of the signal provided to the plurality of switches satisfies the threshold potential.

Example 10

The method of any combination of examples 1-9, further comprising: activating, by one or more diodes electrically positioned between a gate and a drain or a base and a collector of the switch, the switch in response to a gate to drain or a base to collector voltage of the switch exceeding a voltage threshold of the one or more diodes.

Example 11

A system comprising: a switch configured to receive a signal; and control logic configured to: selectively activate, based on a control signal, the switch; responsive to determining that an electrical characteristic of a signal provided to the switch satisfies a threshold while the switch is deactivated, activate, regardless of the control signal, the switch until determining that a potential of the signal provided to the switch satisfies a threshold potential; and responsive to determining that the potential of the signal provided to the switch satisfies the threshold potential, deactivate the switch.

Example 12

The system of example 11, wherein the threshold potential is a second threshold potential, and wherein, to determine that the electrical characteristic of the signal provided to the switch satisfies the threshold, the control logic is configured to: determine that the electrical characteristic of the signal provided to the switch satisfies the threshold in response to determining that the potential of the signal satisfies a first threshold potential that is greater than the second threshold potential.

Example 13

The system of any combination of examples 11-12, wherein the first threshold potential is less than or equal to a breakdown voltage of the switch.

Example 14

The system of any combination of examples 11-13, wherein, to determine that the electrical characteristic of the signal provided to the switch satisfies the threshold, the control logic is configured to: determine that the electrical characteristic of the signal provided to the switch satisfies the threshold in response to determining that a current level of the signal satisfies a current level threshold.

Example 15

The system of any combination of examples 11-14, wherein the control logic is further configured to: determine, based on a current level of the signal, an amount of power dissipated by the switch; determine, based on a temperature of the switch, a power-time threshold for the switch; determine that the electrical characteristic of the signal provided to the switch satisfies the threshold in response to determining that an amount of time for which the switch has been dissipating the amount of power satisfies the power-time threshold for the switch.

Example 16

The system of any combination of examples 11-15, wherein control logic is further configured to determine the power-time threshold based on one or more Wunsch-Bell characteristics of the switch.

Example 17

The system of any combination of examples 11-16, wherein the control logic is included in a switch driver, and wherein in response to determining that the electrical characteristic of the signal provided to the switch satisfies the threshold while the switch is deactivated, the control logic is further configured to one or both of: cause a memory device included in the switch driver to store an indication that an electric transient event has occurred; and output, to a device external to the switch driver, an indication that an electric transient event has occurred.

Example 18

The system of any combination of examples 11-17, wherein the signal is provided to a plurality of switches, and wherein, to activate the switch in response to determining that the electrical characteristic of the signal provided to the switch satisfies the threshold until determining that the potential of the signal provided to the switch satisfies the threshold potential, the control logic is configured to: activate the plurality of switches in response to determining that the electrical characteristic of the signal provided to the plurality of switches satisfies the threshold until determining that the potential of the signal provided to the plurality of switches satisfies the threshold potential.

Example 19

The system of any combination of examples 11-18, further comprising: one or more diodes electrically positioned between a base and a collector or a gate and a drain of the switch, the one or more diodes configured to activate the switch in response to a gate to drain or a base to collector voltage of the switch exceeding a voltage threshold of the one or more diodes.

Example 20

A system or device comprising means for performing the method of any combination of examples 1-10.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules, or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various aspects have been described in this disclosure. These and other aspects are within the scope of the following claims.

The invention claimed is:

1. A method comprising:
    selectively activating, by control logic and based on a control signal, a switch;
    in response to determining that an electrical characteristic of a signal provided to the switch is greater than a threshold while the switch is deactivated, activating, by the control logic and regardless of the control signal, the switch until determining that a potential of the signal provided to the switch is less than a first threshold potential, wherein determining that the electrical characteristic of the signal provided to the switch is greater than the threshold comprises determining that the electrical characteristic of the signal provided to the switch is greater than the threshold in response to determining that the potential of the signal is greater than a second threshold potential that is greater than the first threshold potential; and
    in response to determining that the potential of the signal provided to the switch is less than the first threshold potential, deactivating the switch.

2. The method of claim 1, wherein the second threshold potential is less than or equal to a breakdown voltage of the switch.

3. The method of claim 1, further comprising:
    determining, based on a current level of the signal, an amount of power dissipated by the switch;
    determining, based on a temperature of the switch and one or more Wunsch-Bell characteristics of the switch, a power-time threshold for the switch;
    determining that the electrical characteristic of the signal provided to the switch is greater than the threshold in response to determining that an amount of time for which the switch has been dissipating the amount of power is greater than the power-time threshold for the switch.

4. The method of claim 3, further comprising:
    determining the power-time threshold for the switch based on one or more Wunsch-Bell characteristics of the switch.

5. The method of claim 1, wherein the control logic is included in a switch driver, the method further comprising:
    in response to determining that the electrical characteristic of the signal provided to the switch is greater than the threshold while the switch is deactivated, one or both of:
        storing, by a memory device included in the switch driver, an indication that an electric transient event has occurred; and
        outputting, by the control logic and to a device external to the switch driver, an indication that an electric transient event has occurred.

6. The method of claim 1, wherein the signal is provided to a plurality of switches, and wherein activating the switch in response to determining that the electrical characteristic of the signal provided to the switch is greater than the threshold until determining that the potential of the signal provided to the switch is less than the threshold potential comprises:
    activating the plurality of switches in response to determining that the electrical characteristic of the signal provided to the plurality of switches is greater than the threshold until determining that the potential of the signal provided to the plurality of switches is less than the threshold potential.

7. The method of claim 1, further comprising:
activating, by one or more diodes electrically positioned between a drain and a collector or a gate and a base of the switch, the switch in response to a drain to collector or a gate to base voltage of the switch exceeding a voltage threshold of the one or more diodes.

8. A system comprising:
a switch configured to receive a signal; and
control logic configured to:
  selectively activate, based on a control signal, the switch;
  responsive to determining that an electrical characteristic of the signal received by the switch is greater than a threshold while the switch is deactivated, activate, regardless of the control signal, the switch until determining that a potential of the signal received by the switch is less than a threshold potential, wherein, to determine that the electrical characteristic of the signal received by the switch is greater than the threshold, the control logic is configured to determine that the electrical characteristic of the signal received by the switch is greater than the threshold in response to determining that a current level of the signal is greater than a current level threshold; and
  responsive to determining that the potential of the signal received by the switch is less than the threshold potential, deactivate the switch.

9. The system of claim 8, wherein the control logic is further configured to:
determine, based on the current level of the signal, an amount of power dissipated by the switch;
determine, based on a temperature of the switch, a power-time threshold for the switch;
determine that the electrical characteristic of the signal received by the switch is greater than the threshold in response to determining that an amount of time for which the switch has been dissipating the amount of power is greater than the power-time threshold for the switch.

10. The system of claim 9, wherein control logic is further configured to determine the power-time threshold based on one or more Wunsch-Bell characteristics of the switch.

11. The system of claim 8, wherein the control logic is included in a switch driver, and wherein in response to determining that the electrical characteristic of the signal received by the switch is greater than the threshold while the switch is deactivated, the control logic is further configured to one or both of:
  cause a memory device included in the switch driver to store an indication that an electric transient event has occurred; and
  output, to a device external to the switch driver, an indication that an electric transient event has occurred.

12. The system of claim 8, wherein the system comprises a plurality of switches configured to receive the signal, and wherein the control logic is configured to activate the plurality of switches responsive to determining that the electrical characteristic of the signal received by the plurality of switches is greater than the threshold until determining that the potential of the signal received by the plurality of switches is less than the threshold potential.

13. The system of claim 8, further comprising:
one or more diodes electrically positioned between a drain and a collector or a gate and a base of the switch, the one or more diodes configured to activate the switch in response to a drain to collector or a gate to base voltage of the switch exceeding a voltage threshold of the one or more diodes.

14. The system of claim 8, wherein the threshold potential is less than or equal to a breakdown voltage of the switch.

15. A method comprising:
selectively activating, by control logic and based on a control signal, a switch;
in response to determining that an electrical characteristic of a signal provided to the switch is greater than a threshold while the switch is deactivated, activating, by the control logic and regardless of the control signal, the switch until determining that a potential of the signal provided to the switch is less than a threshold potential, wherein determining that the electrical characteristic of the signal provided to the switch is greater than the threshold comprises determining that the electrical characteristic of the signal provided to the switch is greater than the threshold in response to determining that a current level of the signal is greater than a current level threshold; and
in response to determining that the potential of the signal provided to the switch is less than the threshold potential, deactivating the switch.

16. The method of claim 15, wherein the threshold potential is less than or equal to a breakdown voltage of the switch.

17. The method of claim 15, wherein the control logic is included in a switch driver, the method further comprising:
in response to determining that the electrical characteristic of the signal provided to the switch is greater than the threshold while the switch is deactivated, one or both of:
  storing, by a memory device included in the switch driver, an indication that an electric transient event has occurred; and
  outputting, by the control logic and to a device external to the switch driver, an indication that an electric transient event has occurred.

18. A system comprising:
a switch configured to receive a signal; and
control logic configured to:
  selectively activate, based on a control signal, the switch;
  responsive to determining that a potential of the signal received by the switch is greater than a first threshold potential while the switch is deactivated, activate, regardless of the control signal, the switch until determining that the potential of the signal received by the switch is less than a second threshold potential, wherein the first threshold potential is greater than the second threshold potential; and
  responsive to determining that the potential of the signal received by the switch is less than the second threshold potential, deactivate the switch.

19. The system of claim 18, wherein the first threshold potential is less than or equal to a breakdown voltage of the switch.

20. The system of claim 18, wherein the control logic is included in a switch driver, and wherein, in response to determining that the potential of the signal received by the switch is greater than the first threshold potential while the switch is deactivated, the control logic is further configured to one or both of:

cause a memory device included in the switch driver to store an indication that an electric transient event has occurred; and output, to a device external to the switch driver, an indication that an electric transient event has occurred.

\* \* \* \* \*